(12) United States Patent
Li et al.

(10) Patent No.: US 6,448,536 B2
(45) Date of Patent: Sep. 10, 2002

(54) SINGLE-SUBSTRATE-HEAT-PROCESSING APPARATUS FOR SEMICONDUCTOR PROCESS

(75) Inventors: Yicheng Li; Toshio Takagi, both of Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/824,018

(22) Filed: Apr. 3, 2001

(30) Foreign Application Priority Data

Apr. 7, 2000 (JP) ........................................ 2000-106972

(51) Int. Cl.[7] .................................................. F27B 5/14
(52) U.S. Cl. ........................ 219/390; 219/405; 219/411; 392/416; 118/724; 118/725; 118/50.1
(58) Field of Search ................................ 219/390, 405, 219/411; 118/724, 725, 50.1; 392/416, 418

(56) References Cited

U.S. PATENT DOCUMENTS 5,997,651 A * 12/1999 Matsuse et al. ............. 118/725
6,163,648 A * 12/2000 Moto et al. ................. 392/418

\* cited by examiner

Primary Examiner—Teresa Walberg
Assistant Examiner—Shawntina T. Fuqua
(74) Attorney, Agent, or Firm—Oblon, Spivak, McClelland, Maier & Neustadt, P.C.

(57) ABSTRACT

A single-substrate-heat-processing apparatus includes an airtight process chamber, the interior of which is partitioned into a process space and a lower space by a mount plate and a shield frame. Heating lamps are disposed at a position outside the process chamber and below the mount plate. The mount plate is supported by a shield frame via an isolator, which has a thermal conductivity lower than that of the mount plate. The isolator is formed of a lower member and an upper member. The upper member has outer and inner cover portions, which cover the inner edge of the shield frame and the outer edge of the mount plate, respectively, in a non-contacting state.

25 Claims, 4 Drawing Sheets

SINGLE-SUBSTRATE-HEAT-PROCESSING APPARATUS FOR SEMICONDUCTOR PROCESS

CROSS-REFERENCE TO RELATED APPLICATIONS

This application is based upon and claims the benefit of priority from the prior Japanese Patent Application No. 2000-106972, filed Apr. 7, 2000, the entire contents of which are incorporated herein by reference.

BACKGROUND OF THE INVENTION

The present invention relates to a single-substrate-heat-processing apparatus for performing a semiconductor process, such as oxidation, diffusion, CVD (Chemical Vapor Deposition), or annealing. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or an LCD substrate, by forming semiconductor layers, insulating layers, and conductive layers in predetermined patterns on the target substrate.

In the process of manufacturing semiconductor devices, several types of heat-processing apparatuses are used for subjecting target substrates, such as semiconductor wafers, to a semiconductor process, such as oxidation, diffusion, CVD (Chemical Vapor Deposition), or annealing. A single-substrate-heat-processing apparatus, which handles wafers one by one, is known as one of these heat-processing apparatuses. The single-substrate-heat-processing apparatus allows a heat process to be relatively easily performed with a high planer uniformity on a wafer, even when the heat process requires the process temperature to be raised and lowered quickly. For this reason, the single-substrate-heat-processing apparatus has become popular, as the size of wafers has been larger, and the size of semiconductor devices has been smaller.

The single-substrate-heat-processing apparatus generally includes an airtight process chamber, and a worktable disposed in the process chamber for mounting a target substrate, such as a semiconductor wafer, wherein the wafer is generally heated by the worktable. The heat in the wafer and the worktable is discharged more from their peripheries, and thus the temperature at the periphery of the wafer becomes lower than that at the center. If such non-uniformity in temperature is generated on the wafer, the planar uniformity in the heat process is lowered, and, for example, in a film formation process, the thickness of the formed film becomes uneven. This problem is more serious in a single-substrate-heat-processing apparatus of the lamp-heating type, in which a wafer is heated by lamps disposed below a worktable.

BRIEF SUMMARY OF THE INVENTION

An object of the present invention is to provide a single-substrate-heat-processing apparatus for a semiconductor process, which allows a target substrate, such as a wafer, to be uniformly heated, and thus allows a process to be performed with a high planar uniformity.

According to a first aspect of the present invention, there is provided a single-substrate-heat-processing apparatus for performing a semiconductor process, comprising:

an airtight process chamber;

a mount plate configured to support a target substrate within the process chamber, the mount plate consisting essentially of one or more material selected from the group consisting of silicon carbide, aluminum nitride, black aluminum nitride, and carbon coated with CVD-SiC;

a metal support frame configured to support the mount plate;

an isolator intervening between the mount plate and the support frame to substantially prevent the mount plate and the support frame from coming into direct contact with each other, the isolator consisting essentially of one or more material selected from the group consisting of aluminum oxide, aluminum nitride, silicon nitride, silicon oxide, and zirconia;

a supply section configured to supply a process gas into the process chamber;

an exhaust section configured to vacuum-exhaust the process chamber; and a heater configured to heat the target substrate on the mount plate.

According to a second aspect of the present invention, there is provided a single-substrate-heat-processing apparatus for performing a semiconductor process, comprising:

an airtight process chamber;

a metal shield frame partitioning the process chamber into a process space on an upper side and a lower space on a lower side, the shield plate having an opening and an inwardly extending portion extending in the opening;

amount plate configured to support a target substrate within the process space, the mount plate consisting essentially of one or more material selected from the group consisting of silicon carbide, aluminum nitride, black aluminum nitride, and carbon coated with CVD-SiC, and mounted on the inwardly extending portion to partition the process chamber into the process space and the lower space;

an isolator intervening between the mount plate and the shield frame to substantially prevent the mount plate and the shield frame from coming into direct contact with each other, the isolator consisting essentially of one or more material selected from the group consisting of aluminum oxide, aluminum nitride, silicon nitride, silicon oxide, and zirconia, wherein the isolator comprises a lower member mounted on the inwardly extending portion, and an upper member formed independently of the lower member and mounted on the lower member, and the upper member comprises an outer cover portion covering an inner edge of the shield frame to prevent the process gas from entering downward, and an inner cover portion covering an outer edge of the mount plate to prevent the process gas from entering downward and to restrict movement of the mount plate in a vertical direction;

a supply section configured to supply a process gas into the process space;

an exhaust section configured to vacuum-exhaust the process chamber; and a heating lamp disposed below the mount plate to radiate light onto the mount plate, thereby heating the target substrate on the mount plate.

According to a third aspect of the present invention, there is provided a single-substrate-heat-processing apparatus for performing a semiconductor process, comprising:

an airtight process chamber;

a metal shield frame partitioning the process chamber into a process space on an upper side and a lower space on a lower side, the shield plate having an opening and an inwardly extending portion extending in the opening;

a mount plate configured to support a target substrate within the process space, the mount plate being mounted on the inwardly extending portion to partition the process chamber into the process space and the lower space;

an isolator intervening between the mount plate and the shield frame to substantially prevent the mount plate and the shield frame from coming into direct contact with each other, the isolator consisting essentially of a material having a thermal conductivity lower than that of the mount plate;

a supply section configured to supply a process gas into the process space;

an exhaust section configured to vacuum-exhaust the process chamber;

a plurality of lifter pins disposed in the lower space, for assisting load and unload of the target substrate relative to the mount plate, and configured to project and retreat relative to the mount plate through holes formed in the mount plate;

a heating lamp disposed at a position outside the process chamber and below the mount plate to radiate light onto the mount plate, thereby heating the target substrate on the mount plate; and a window formed in a wall of the process chamber to face the heating lamp, and configured to allow the light from the heating lamp to pass through.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described hereinafter with reference to the accompanying drawings. In the following description, the constituent elements having substantially the same function and arrangement are denoted by the same reference numerals, and a repetitive description will be made only when necessary.

Figure 1:
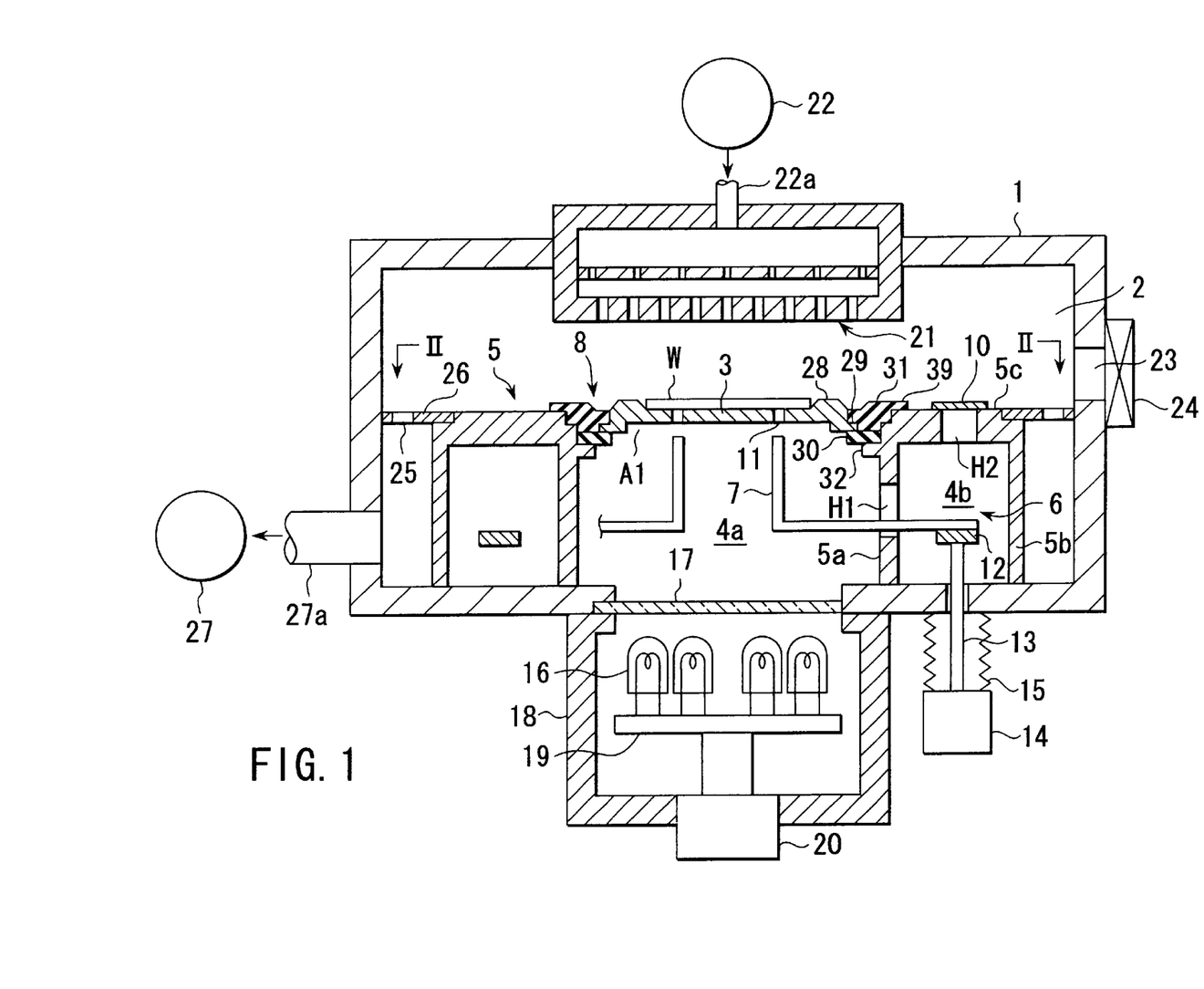
FIG. 1 is a schematic sectional view showing a single-substrate-heat-processing apparatus according to an embodiment of the present invention.
Figure 2:
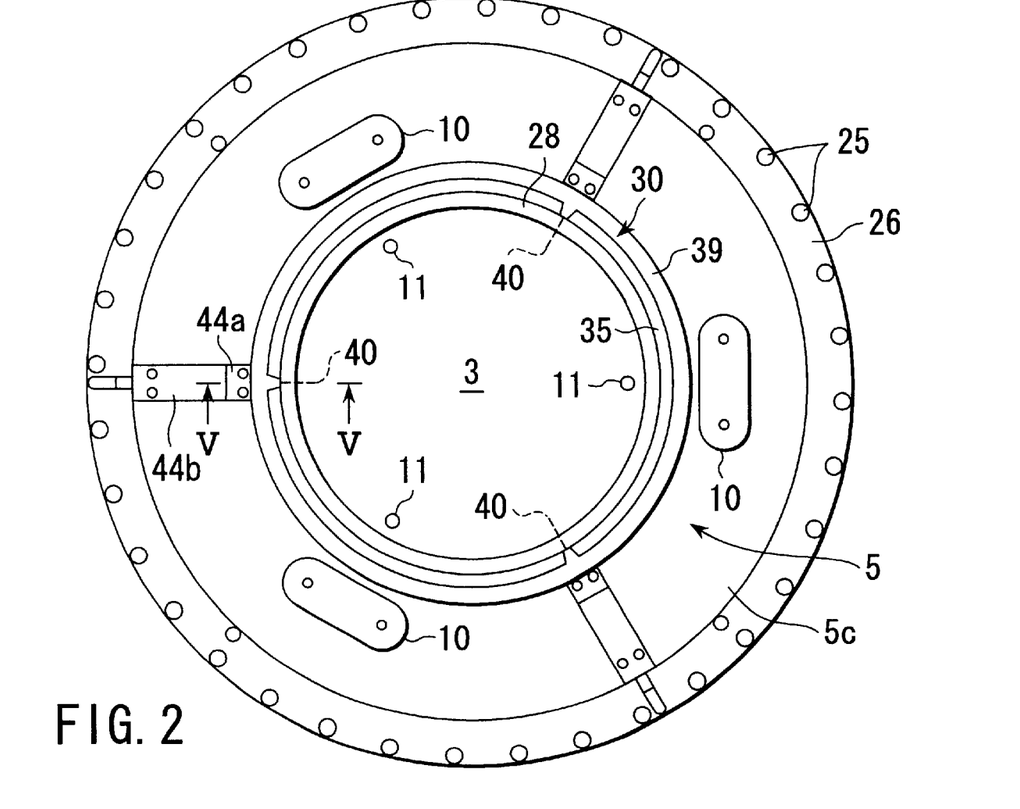
FIG. 2 is a plan view taken in accordance with arrows II—II in FIG. 1.

FIG. 1 is a schematic sectional view showing a single-substrate-heat-processing apparatus according to an embodiment of the present invention. FIG. 2 is a plan view taken in accordance with arrows II—II in FIG. 1. The single-substrate-heat-processing apparatus shown in FIG. 1 is constituted to subject target substrates, such as semiconductor wafers W, one by one to a semiconductor process, such as MOCVD (Metal Organic Chemical Vapor Deposition). The apparatus includes a box-like process chamber 1, which is airtight and is capable of being pressure-reduced. The process chamber 1 is made of a material, such as aluminum, which is heat-resistant, corrosion-resistant, and non-contaminating to the wafers W. The process chamber 1 is substantially airtightly divided into an upper process space 2, and two lower spaces 4a and 4b, by a mount plate (susceptor) 3 for mounting a wafer W, and an annular shield frame (shield ring) 5, which is made of a metal, such as aluminum, and supports the peripheral edge of the mount plate 3.

The shield frame 5 has an inner cylinder 5a defining a central opening A1, and an outer cylinder 5b disposed concentric with the inner cylinder 5a. The inner and outer cylinders 5a and 5b are connected to each other by a flat annular portion 5c covering the portion between the top edges of the cylinders 5a and 5b. The inner cylinder 5a is provided with a plurality of, e.g., three, through hole slits H1 at intervals, e.g., regular intervals, in the angular direction. Each of the slits H1 is formed to allow the movement of an L-shaped lifter pin 7 (the total number of the pins 7 is three) of an elevating mechanism 6, which moves the wafer W up and down relative to the mount plate 3 when the wafer W is loaded and unloaded. The flat portion 5c is provided with a plurality of, e.g., three, through holes H2 at intervals, e.g., regular intervals, in the angular direction, for performing the adjustment and maintenance of the elevating mechanism 6. Each of the holes H2 is airtightly closed by a lid 10 placed from above and detachably fixed by screws (see FIG. 2).

The mount plate 3 is provided with holes through which the respective distal ends of the lifter pins 7 vertically penetrate. The proximal ends of the lifter pins 7 are fixed to a common annular elevating frame 12 disposed in the annular space 4b formed between the inner and outer cylinders 5a and 5b. The elevating frame 12 is connected to a driving section (actuator) 14 disposed outside the process chamber 1, by an elevating shaft 13 penetrating the bottom of the process chamber 1. In order to ensure that the process chamber 1 is airtight, a bellows 15 is arranged between the process chamber 1 and the driving section 14 of the elevating mechanism 6. The lifter pins 7 are made of a material, such as quartz, which allows heat rays to pass through.

A plurality of heating lamps 16 are disposed, as means for heating the wafer W, at a position outside the process chamber 1 and below the mount plate 3, i.e., below the lower central space 4a. The heating lamps 16 radiate light to the mount plate 3, thereby heating the wafer W on the mount plate 3. A window 17 is formed in the wall of the process chamber 1 to face the heating lamps 16, and allows light (heat rays) from the heating lamps 16 to pass through. The window 17 is airtightly arranged at the center of the bottom of the process chamber to face the mount plate 3 through the central space 4a surrounded by the inner cylinder 5a of the shield frame 5.

A box-like heating chamber 18 is disposed on and outside the bottom of the process chamber 1 to surround the window 17 and accommodate the heating lamps 16. The heating lamps 16 are attached to a rotational plate 19 functioning as a reflection mirror, which is rotated by a motor 20 disposed on the bottom of the heating chamber 18. While being rotated, the heating lamps 16 radiate heat rays to the bottom of the mount plate 3 through the window 17, so that the wafer W is heated with a high planar uniformity by the heated mount plate 3.

The bottom of the process chamber 1 is connected to an inactive gas supply (not shown) for supplying an inactive gas, such as nitrogen gas, into the central space 4a under the mount plate 3. Supplying an inactive gas into the central space 4a prevents a process gas from entering therein from the other space partitioned by the mount plate 3 and the shield frame 5.

A showerhead 21 is disposed on the ceiling of the process chamber 1, for supplying a process gas into the process chamber 1. The showerhead 21 is situated at a position opposite to the mount plate 3 to uniformly supply the process gas onto the surface (target surface) of the wafer W. The top of the showerhead 21 is connected to a gas supply section 22 through a supply line 22a, for supplying the process gas at a controlled flow rate.

A port 23 is formed in the sidewall of the process chamber 1, for transferring the wafer W into and out of the process chamber 1 by a transfer arm (not shown). The port 23 is opened and closed by a gate valve 24. An annular rectifying plate 26 having a number of rectifying holes 25 is disposed around the top of the shield frame 5 and covers the portion between the shield frame 5 and the inner surface of the process chamber 1. An exhaust section 27 is connected to the sidewall of the process chamber 1 under the rectifying plate 26 through an exhaust line 27a, for vacuum-exhausting the process chamber 1. The exhaust section 27 includes a vacuum pump and a pressure regulator to set the interior of the process chamber at a predetermined pressure or vacuum.

The mount plate 3 has a circular shape larger than the wafer W. The top surface of the mount plate 3 is provided with an annular bank or ridge 28 for surrounding the wafer W, so that heat discharge from the peripheral edge of the wafer W is suppressed. An annular flange 29 is formed at the peripheral edge of the mount plate 3, so that it is sandwiched and supported by an isolator 8, which will be described later.

The mount plate 3 is made of a material, which is heat-resistant, corrosion-resistant, non-contaminating to the wafers W, and having a high thermal conductivity. For example, the mount plate 3 is made of one or more materials, selected from the group consisting of silicon carbide (SiC), aluminum nitride, black aluminum nitride, and carbon coated with CVD-SiC.

Figure 3:
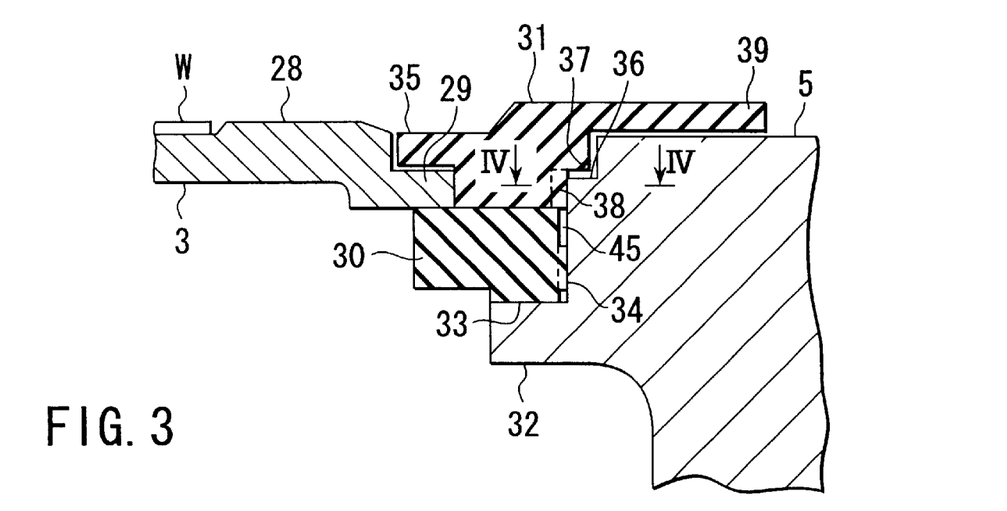
FIG. 3 is an enlarged sectional view showing a mount-plate-supporting structure, used in the apparatus shown in FIG. 1.

FIG. 3 is an enlarged sectional view showing a mount-plate-supporting structure, used in the apparatus shown in FIG. 1. The isolator 8 intervenes between the mount plate 3 and the shield frame 5 to substantially prevent them from coming into direct contact with each other. The isolator 8 is constituted of a lower member (base ring) 30 placed on the shield frame 5, and an upper member 31 (isolation ring) 31 formed independently of the lower member 30 and placed on the lower member 30. The lower member 30 has a function of positioning the mount plate 3 in the vertical direction, while the upper member 31 has a function of positioning the mount plate 3 in the horizontal direction. The upper member 31 also has a function of restricting the movement of the mount plate 3 from above, so as for the mount plate 3 not to be blown off or moved when the process chamber 1 is subjected to a rough exhaust operation during the initial stage of reducing the pressure of the process chamber 1.

The lower and upper members 30 and 31 of the isolator 8 are each made of a material, which is heat-resistant, corrosion-resistant, non-contaminating to the wafers W, and having a low thermal conductivity. For example, the lower and upper members 30 and 31 are each made of one or more materials, selected from the group consisting of aluminum oxide ($Al_2O_3$), aluminum nitride, silicon nitride, silicon oxide ($SiO_2$) including quartz, and zirconia (PSZ). As one example, the lower member 30 is made of quartz, while the upper member 31 is made of aluminum oxide.

Near the top of the inner surface of the inner cylinder 5a, which defines the central opening A1 of the shield frame 5, a plurality of inwardly extending portions 32 are discontinuously formed in the angular direction, for supporting the mount plate 3 via the isolator 8. The lower member 30 of the isolator 8 is placed on the inwardly extending portions 32, and the mount plate 3 and the upper member 31 of the isolator 8 are mounted on the lower member 30. For example, three inwardly extending portions 32 are arranged at intervals, e.g., regular intervals, in the angular direction. The inwardly extending portions 32 reduces the contacting surface area between the bottom of the lower member 30 and the shield frame 5, so that heat discharge by means of thermal conduction from the lower member 30 to the shield frame 5 is suppressed. However, the inwardly extending portions 32 may be replaced with an inwardly extending portion 32 formed by a ring flange, i.e., a shape continuous in the angular direction.

The bottom of the lower member 30 is provided with a projection 33 continuous in the angular direction, which is in contact with the top surface of the inwardly extending portions 32. Alternatively, where an inwardly extending portion 32 has a ring flange shape continuous in the angular direction, the projection 33 should be replaced with a plurality of projections disposed at intervals in the angular direction to reduce the contacting surface area. The outer peripheral surface of the lower member 30 is provided with a projection 34 continuous in the angular direction, which has a small width such that the contacting surface area relative to the inner peripheral surface of the shield frame 5 is reduced.

The upper member 31 has an inner cover portion 35 of a ring shape formed to cover the outer edge of the mount plate 3, i.e., the flange 29 of the mount plate 3. The inner cover portion 35 prevents a process gas from entering downward, and restricts the movement of the mount plate 3 in the vertical direction. In order not to increase the contacting surface area relative to the mount plate 3, the inner cover portion 35 is arranged not to come into contact with the flange 29, but to face the top surface of the flange 29 with a gap of from 0.1 to 0.3 mm, and preferably from 0.1 to 0.2 mm.

The upper member 31 also has an outer cover portion 39 of a ring shape formed to cover the inner edge of the shield frame 5. The outer cover portion 39 prevents a process gas from entering downward. In order not to increase the contacting surface area relative to the shield frame 5, the outer cover portion 39 may be arranged not to come into contact with the shield frame 5, but to face the top surface of the shield frame 5 with a gap. The distance between the outer cover portion and the top surface of the shield frame 5 is set to be from 0 to 0.1 mm, and preferably from almost 0 to 0.05 mm.

Figure 4:
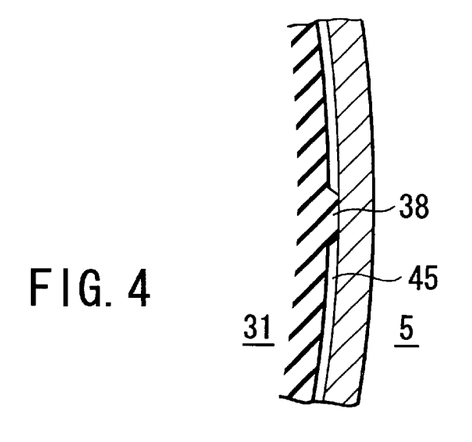
FIG. 4 is a sectional view taken along a line IV—IV in FIG. 3.

A ring-like step 36 is formed near the inner edge of the shield frame 5 and at a height almost the same as that of the flange 29 of the mount plate 3. A step 37 corresponding to the step 36 is formed on the outer peripheral surface of the upper member 31. The upper member 31 is provided with a plurality of projections 38 discontinuously formed in the angular direction, on the outer peripheral surface below the step 37. FIG. 4 is a sectional view showing a projection 38 and taken along a line IV—IV in FIG. 3. For example, three projections 38 are arranged at intervals, e.g., regular intervals, in the angular direction. The projections 38 reduces the contacting surface area between the outer peripheral surface of the upper member 31 and the inner peripheral surface of the shield frame 5, so that heat discharge by means of thermal conduction from the upper member 31 to the shield frame 5 is suppressed.

A plurality of temperature-detecting members 40, each having a thin rod shape, are disposed such that they horizontally penetrate the upper member 31 from the shield frame 5 and stick into the mount plate 3.

Figure 5:
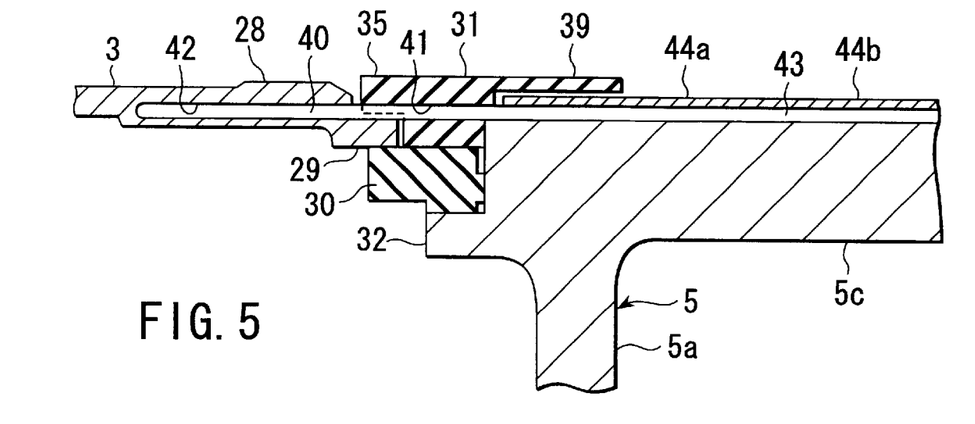
FIG. 5 is an enlarged sectional view taken along a line V—V in FIG. 2.

FIG. 5 is an enlarged sectional view showing one of the temperature-detecting members 40 and taken along a line V—V in FIG. 2. The temperature-detecting members 40 are used to detect the temperature of the mount plate 3. Each of the temperature-detecting members 40 is covered with an isolation tube made of, e.g., aluminum, and having a diameter as thin as 1 to 2 mm, within the tip of which a thermocouple is disposed (not shown). For example, three temperature-detecting members 40 are radially arranged at intervals, e.g., regular intervals, in the angular direction, and also function as means for fixing the mount plate 3 and the isolator 8.

In order to attach the temperature-detecting members 40, grooves 43 are formed in the top surface of the shield frame 5, and insertion holes 41 and 42 are formed in the upper member 31 and the mount plate 3, respectively. The temperature-detecting members 40 are radially inserted into the grooves and the holes from outer positions, such that each distal end portion is inserted into the holes 41 and 42 while each proximal end portion is placed in the groove 43 of the shield frame 5, in the attached state. Cover members 44a and 44b are detachably fixed to the top surface of the shield frame 5 by screws to cover the temperature-detecting members 40 in the grooves 43. Lead lines connected to the proximal end portions of the temperature-detecting members 40 airtightly penetrate the side or bottom of the process chamber 1 to the outside, and are connected to a control unit (not shown). The control unit controls the temperature of the mount plate by adjusting the output of the heating lamps 16, on the basis of detected temperatures.

An explanation will be given of a method of processing a semiconductor wafer, to be performed in the single-substrate-heat-processing apparatus shown in FIG. 1.

First, the gate valve 24 at the port 23 of the process chamber 1 is opened and a wafer W is transferred into the process chamber 1 by a transfer arm. Then, the lifter pins 7 are moved up to receive the wafer W from the transfer arm. Then, the lifter pins 7 are moved down to place the wafer W on the mount plate 3, while the gate valve 24 is closed.

Then, the process chamber 1 is vacuum-exhausted by the exhaust section 27, and a process gas is supplied into the process chamber 1 from the gas supply section 22 through the showerhead 21, at a predetermined flow rate, so that the process chamber 1 is set at a predetermined vacuum pressure. The heating lamps 16 are turned on to heat the wafer W up to a predetermined temperature through the mount plate 3, so that the target surface of the wafer W stars being subjected to a process, such as an MOCVD process. The heating lamps 16 radiate heat-rays onto the bottom of the mount plate 3 through the window 17 to heat the mount plate 3. Since the mount plate 3 is as thin as a few millimeters, it is swiftly heated, so that the wafer W thereon is also swiftly heated up to a predetermined temperature.

Heat in the mount plate 3 is apt to be discharged from the periphery to the shield frame 5 by means of contact thermal conduction. However, the insulator 8 having a low thermal conductivity intervenes between the mount plate 3 and the shield frame 5, and prevents the heat from being discharged by means of thermal conduction. In addition, the projections 34 and 38 formed on the outer peripheral surface of the insulator 8 reduces the contacting surface area between the insulator 8 and the shield frame 5, and further lowers the thermal conduction from the insulator 8 to the shield frame 5. Also, the slim isolation tubes covering the temperature-detecting members 40 prevent the heat from being discharged through the temperature-detecting members 40 by means of thermal conduction.

As a result, it is possible to suppress heat discharge from the periphery of the mount plate 3, which supports the wafer W, thereby heating and processing the wafer W with a high planar uniformity. Furthermore, the annular bank or ridge 28 formed on the mount plate 3 to surround the wafer W prevents heat from being discharged from the periphery of the wafer W, thereby further improving the planar uniformity in the process performed on the wafer W.

The projections 34 and 38 formed on the outer peripheral surface of the insulator 8 bring about gaps 45 between the outer peripheral surface of the insulator 8 and the inner peripheral surface of the shield frame 5, which allow the process gas to pass through into the central space 4a. However, the outer cover portion 39 formed on the upper member 31 covers the inner edge of the shield frame 5 in a non-contacting state and prevents the process gas from entering. Consequently, the process gas cannot flow to the backside of the mount plate 3 through the gaps 45 between the isolator 8 and the shield frame 5. As a result, the bottom of the mount plate 3 can be free from adhering products derived from the process gas, which would deteriorate the thermal uniformity of the mount plate 3.

The temperature-detecting members 40 are arranged such that they penetrate the upper member 31 from the shield frame 5 and stick into the mount plate 3. The temperature-detecting members 40, which are used basically for measuring the temperature of the mount plate 3, allows the mount plate 3 and the isolator 8 to be easily and securely fixed to the shield frame 5.

Figure 6:
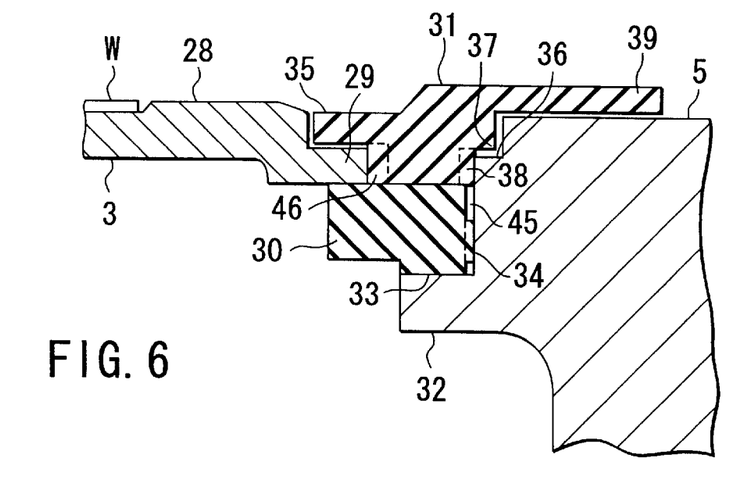
FIG. 6 is an enlarged sectional view showing a mount-plate-supporting structure, used in an apparatus according to another embodiment of the present invention.
Figure 7:
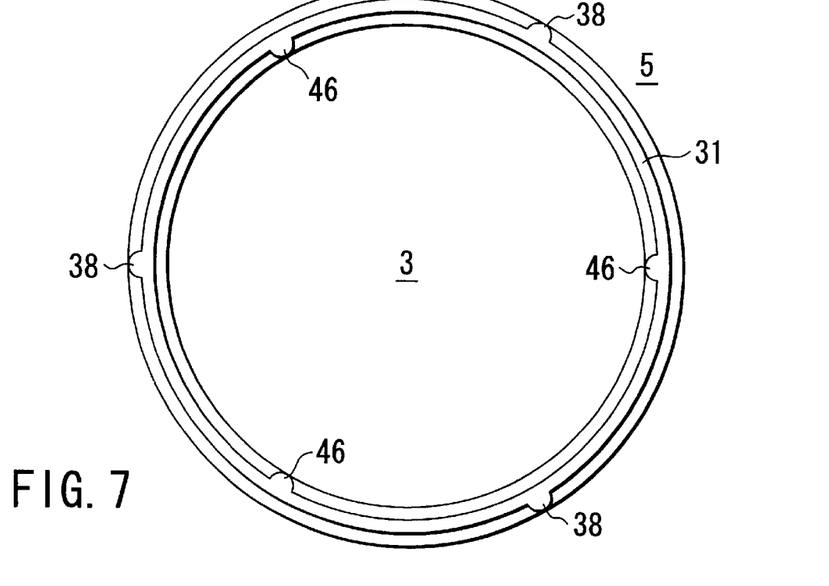
FIG. 7 is a deformed plan view showing the relationship between projections on the outer side and projections on the inner side, in the mount-plate-supporting structure shown in FIG. 6.

FIG. 6 is an enlarged sectional view showing a mount-plate-supporting structure, used in an apparatus according to another embodiment of the present invention. In addition to the structure of the above-described embodiment, this embodiment includes a plurality of projections 46, which are discontinuously formed in the angular direction, on the inner peripheral surface of an upper member 31 under an inner cover portion 35. FIG. 7 is a deformed plan view showing the relationship between projections 38 on the outer side and the projections 46 on the inner side, in the mount-plate-supporting structure shown in FIG. 6. As shown in FIG. 7, for example, three projections 46 are arranged at intervals, e.g., regular intervals, in the angular direction. The projections 46 are located at the center of the projections 38 formed on the outer peripheral surface 38 of the upper member 31, i.e., the projections 46 and the projections 38 are alternately disposed, in the angular direction. The projections 46 reduce the contacting surface area between the outer peripheral surface of the mount plate 3 and the inner peripheral surface of the upper member 31, so that heat discharge by means of thermal conduction from the mount plate 3 to the upper member 31 is suppressed.

The projections 46 formed on the inner peripheral surface of the upper member 31 bring about gaps between the outer peripheral surface of the mount plate 3 and the inner peripheral surface of the upper member 31, which allow the process gas to pass through into the central space 4a. However, the inner upper cover portion 35 formed on the upper member 31 covers the outer edge of the mount plate 3 in a non-contacting state and prevents the process gas from entering. Consequently, the process gas cannot flow to the backside of the mount plate 3 through the gaps between the mount plate 3 and the upper member 31. As a result, the bottom of the mount plate 3 can be free from adhering products derived from the process gas, which would deteriorate the thermal uniformity of the mount plate 3.

Figure 8:
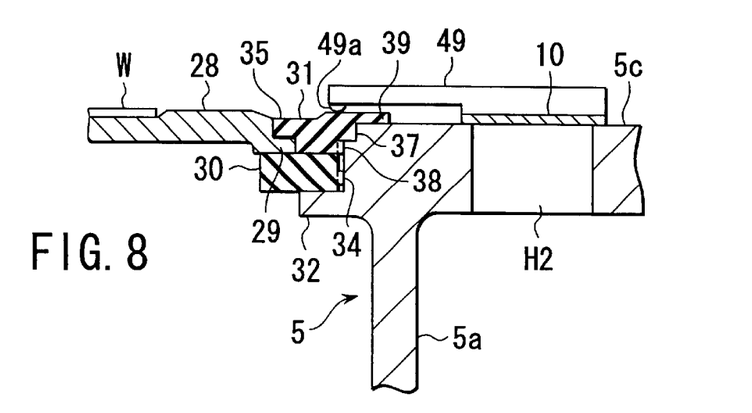
FIG. 8 is an enlarged sectional view showing a mount-plate-supporting structure, used in an apparatus according to still another embodiment of the present invention.

FIG. 8 is an enlarged sectional view showing a mount-plate-supporting structure, used in an apparatus according to still another embodiment of the present invention. In this embodiment, a plurality of, e.g., three, restriction arms 49 are arranged to push the upper member 31 of an isolator 8 against the lower member 30 of the isolator 8. The restriction arms 49 extend from a shield frame 5 to the upper member 31 and come into point contact with the top surface of the upper member 31. The restriction arms 49 are made of a material, such as quartz or aluminum. The distal end of each restriction arm 49 is provided with a spherical ferrule, which comes into point contact with the top surface of the upper member 31.

For example, the proximal end of each restriction arm 49 is fixed to the lid 10, which is used for closing the maintenance through hole H2 formed in the shield frame 5. Where the restriction arms 49 are made of a material different from that of the lids 10, they are fixed to the lids 10 by, e.g., screws. The restriction arms 49 may be made of a material the same as that of the lids 10, and formed integrally with the respective lids 10. According to the embodiment shown in FIG. 8, the restriction arms 49 come into point contact with the upper member 31 not to increase the heat conduction therebetween, thereby allowing the periphery of the mount plate 3 to be thermally stable.

Figure 9:
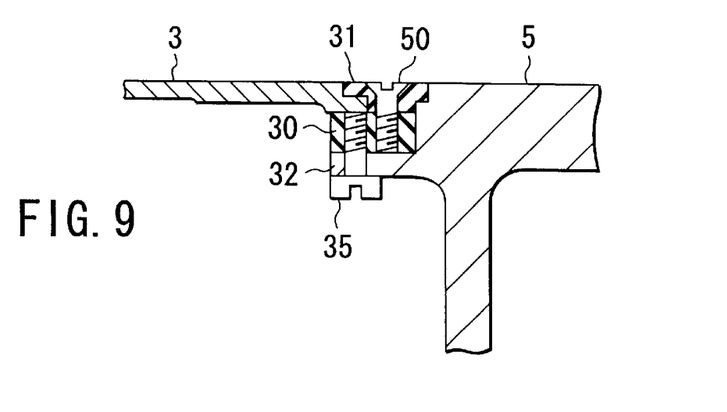
FIG. 9 is an enlarged sectional view showing a mount-plate-supporting structure, used in an apparatus according to still another embodiment of the present invention.

FIG. 9 is an enlarged sectional view showing a mount-plate-supporting structure, used in an apparatus according to still another embodiment of the present invention. The embodiment differs from the former embodiments in that an isolator 8 is fixed to a shield frame 5 by screws 50 and 51. More specifically, the isolator 8 consists of lower and upper members 30 and 31 each having a ring shape, and each made of a material having a low thermal conductivity, as described previously. The upper member 31 has an inner cover portion 35 having a ring shape and covering the outer edge of a mount plate 3, and an outer cover portion 39 having a ring shape and covering the inner edge of a shield frame 5. The inner and outer cover portions 35 and 39 prevent a process gas from entering downward, and restrict movement of the mount plate 3 in the vertical direction.

The lower member 30 is fixed to an inner extending portion 32 formed on the shield frame 5, by screws 50. The upper member 31 is fixed to the lower member 30 by screws 51. Although the screws 50 and 51 are shown adjacent to each other in FIG. 9, they are actually located separate from each other in the angular direction. The screws 50 and 51 are preferably made of a ceramic material having a low thermal conductivity, but may be made of a metal. According to the embodiment shown in FIG. 9, the insulator 8 having a low thermal conductivity also intervenes between the mount plate 3 and the shield frame 5, and prevents the heat from being discharged by means of thermal conduction.

In the above-described embodiments shown in FIG. 1 etc., the projections 38 are formed on the outer peripheral surface of the isolator 8 to reduce the contacting surface area between the outer peripheral surface of the isolator 8 and the inner peripheral surface of the shield frame 5. The same effect may be obtained by projections formed on the inner peripheral surface of the shield frame 5. In the embodiment shown in FIG. 6, the projections 46 are formed on the inner peripheral surface of the isolator 8 to reduce the contacting surface area between the outer peripheral surface of the mount plate 3 and the inner peripheral surface of the isolator 8. The same effect may be obtained by projections formed on the outer peripheral surface of the mount plate 3.

The present invention may be applied to a processing apparatus, other than a CVD apparatus, such as an oxidizing, diffusing, or annealing apparatus. Furthermore, the present invention may be applied to a target substrate other than a semiconductor wafer, such as an LCD substrate, or a glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A single-substrate-heat-processing apparatus for performing a semiconductor process, comprising:

an airtight process chamber;

a metal shield frame partitioning the process chamber into a process space on an upper side and a lower space on a lower side, the shield plate having an opening and an inwardly extending portion extending in the opening;

a mount plate configured to support a target substrate within the process space, the mount plate consisting essentially of one or more material selected from the group consisting of silicon carbide, aluminum nitride, black aluminum nitride, and carbon coated with CVD-SiC, and mounted on the inwardly extending portion to partition the process chamber into the process space and the lower space;

an isolator intervening between the mount plate and the shield frame to substantially prevent the mount plate and the shield frame from coming into direct contact with each other, the isolator consisting essentially of one or more material selected from the group consisting of aluminum oxide, aluminum nitride, silicon nitride, silicon oxide, and zirconia, wherein the isolator comprises a lower member mounted on the inwardly extending portion, and an upper member formed independently of the lower member and mounted on the lower member, and the upper member comprises an outer cover portion covering an inner edge of the shield frame to prevent the process gas from entering downward, and an inner cover portion covering an outer edge of the mount plate to prevent the process gas from entering downward and to restrict movement of the mount plate in a vertical direction;

a supply section configured to supply a process gas into the process space;

an exhaust section configured to vacuum-exhaust the process chamber; and a heating lamp disposed below the mount plate to radiate light onto the mount plate, thereby heating the target substrate on the mount plate.

2. The apparatus according to claim 1, wherein the outer cover portion and inner cover portion face the inner edge of the shield frame and the outer edge of the mount plate, respectively, in a non-contacting state.

3. The apparatus according to claim 2, wherein the upper member and the shield frame have an outer peripheral surface and an inner peripheral surface, respectively, which face each other, and a plurality of projections are formed at intervals on the outer peripheral surfaces of the upper member under the outer cover portion to reduce a contacting surface area between the outer and inner peripheral surfaces.

4. The apparatus according to claim 2, wherein the mount plate and the upper member have an outer peripheral surface and an inner peripheral surface, respectively, which face each other, and a plurality of projections are formed at intervals on the inner peripheral surface of the upper member under the inner cover portion to reduce a contacting surface area between the outer and inner peripheral surfaces.

5. A single-substrate-heat-processing apparatus for performing a semiconductor process, comprising:

an airtight process chamber;

a metal shield frame partitioning the process chamber into a process space on an upper side and a lower space on a lower side, the shield plate having an opening and an inwardly extending portion extending in the opening;

a mount plate configured to support a target substrate within the process space, the mount plate being mounted on the inwardly extending portion to partition the process chamber into the process space and the lower space;

an isolator intervening between the mount plate and the shield frame to substantially prevent the mount plate and the shield frame from coming into direct contact with each other, the isolator consisting essentially of a material having a thermal conductivity lower than that of the mount plate;

a supply section configured to supply a process gas into the process space;

an exhaust section configured to vacuum-exhaust the process chamber;

a plurality of lifter pins disposed in the lower space, for assisting load and unload of the target substrate relative to the mount plate, and configured to project and retreat relative to the mount plate through holes formed in the mount plate;

a heating lamp disposed at a position outside the process chamber and below the mount plate to radiate light onto the mount plate, thereby heating the target substrate on the mount plate;

a window formed in a wall of the process chamber to face the heating lamp, and configured to allow the light from the heating lamp to pass through; and a plurality of temperature-detecting members disposed at intervals in an angular direction on the mount plate, such that the temperature-detecting members extend from the shield frame, penetrate the isolator, and stick into the mount plate.

6. The apparatus according to claim 5, wherein the mount plate is provided with a bank formed to surround the target substrate.

7. A single-substrate-heat-processing apparatus for performing a semiconductor process, comprising:

an airtight process chamber;

a mount plate configured to support a target substrate within the process chamber, the mount plate consisting essentially of one or more material selected from the group consisting of silicon carbide, aluminum nitride, black aluminum nitride, and carbon coated with CVD-SiC;

a metal support frame configured to support the mount plate;

an isolator intervening between the mount plate and the support frame to substantially prevent the mount plate and the support frame from coming into direct contact with each other, the isolator consisting essentially of one or more material selected from the group consisting of aluminum oxide, aluminum nitride, silicon nitride, silicon oxide, and zirconia;

a supply section configured to supply a process gas into the process chamber;

an exhaust section configured to vacuum-exhaust the process chamber; and a heater configured to heat the target substrate on the mount plate;

wherein the support frame comprises an inwardly extending portion, on which the mount plate is mounted via the isolator;

wherein the isolator comprises a lower member mounted on the inwardly extending portion, and an upper member formed independently of the lower member and mounted on the lower member; and wherein the upper member comprises an outer cover portion covering an inner edge of the support frame to prevent the process gas from entering downward.

8. The apparatus according to claim 7, wherein the isolator and the support frame have an outer peripheral surface and an inner peripheral surface, respectively, which face each other, and a plurality of projections are formed at intervals on either one of the outer and inner peripheral surfaces to reduce a contacting surface area therebetween.

9. The apparatus according to claim 7, wherein the isolator and the inner extending portion are arranged in contact with each other discontinuously in an angular direction to reduce a contacting surface area therebetween.

10. The apparatus according to claim 7, wherein the mount plate is provided with a bank formed to surround the target substrate.

11. The apparatus according to claim 7, wherein the heater comprises a heating lamp disposed below the mount plate to radiate light onto the mount plate.

12. A single-substrate-heat-processing apparatus for performing a semiconductor process, comprising:

an airtight process chamber;

a mount plate configured to support a target substrate within the process chamber, the mount plate consisting essentially of one or more material selected from the group consisting of silicon carbide, aluminum nitride, black aluminum nitride, and carbon coated with CVD-SiC;

a metal support frame configured to support the mount plate;

an isolator intervening between the mount plate and the support frame to substantially prevent the mount plate and the support frame from coming into direct contact with each other, the isolator consisting essentially of one or more material selected from the group consisting of aluminum oxide, aluminum nitride, silicon nitride, silicon oxide, and zirconia;

a supply section configured to supply a process gas into the process chamber;

an exhaust section configured to vacuum-exhaust the process chamber; and a heater configured to heat the target substrate on the mount plate;

wherein the support frame comprises an inwardly extending portion, on which the mount plate is mounted via the isolator;

wherein the isolator comprises a lower member mounted on the inwardly extending portion, and an upper member formed independently of the lower member and mounted on the lower member; and wherein the upper member comprises an inner cover portion covering an outer edge of the mount plate to prevent the process gas from entering downward and to restrict movement of the mount plate in a vertical direction.

13. The apparatus according to claim 12, wherein the mount plate and the isolator have an outer peripheral surface and an inner peripheral surface, respectively, which face each other, and a plurality of projections are formed at intervals on either one of the outer and inner peripheral surfaces to reduce a contacting surface area therebetween.

14. The apparatus according to claim 12, wherein the mount plate is provided with a bank formed to surround the target substrate.

15. The apparatus according to claim 12, wherein the heater comprises a heating lamp disposed below the mount plate to radiate light onto the mount plate.

16. A single-substrate-heat-processing apparatus for performing a semiconductor process, comprising:

an airtight process chamber;

a mount plate configured to support a target substrate within the process chamber, the mount plate consisting essentially of one or more material selected from the group consisting of silicon carbide, aluminum nitride, black aluminum nitride, and carbon coated with CVD-SiC;

a metal support frame configured to support the mount plate;

an isolator intervening between the mount plate and the support frame to substantially prevent the mount plate and the support frame from coming into direct contact with each other, the isolator consisting essentially of one or more material selected from the group consisting of aluminum oxide, aluminum nitride, silicon nitride, silicon oxide, and zirconia;

a supply section configured to supply a process gas into the process chamber;

an exhaust section configured to vacuum-exhaust the process chamber; and a heater configured to heat the target substrate on the mount plate;

wherein the support frame comprises an inwardly extending portion, on which the mount plate is mounted via the isolator;

wherein the isolator comprises a lower member mounted on the inwardly extending portion, and an upper member formed independently of the lower member and mounted on the lower member;

and further comprising a plurality of restriction arms attached to the support frame and pushing the upper member against the lower member.

17. The apparatus according to claim 16, wherein the restriction arms come into point contact with the upper member.

18. The apparatus according to claim 16, wherein the heater comprises a heating lamp disposed below the mount plate to radiate light onto the mount plate.

19. A single-substrate-heat-processing apparatus for performing a semiconductor process, comprising:

an airtight process chamber;

a mount plate configured to support a target substrate within the process chamber, the mount plate consisting essentially of one or more material selected from the group consisting of silicon carbide, aluminum nitride, black aluminum nitride, and carbon coated with CVD-SiC;

a metal support frame configured to support the mount plate;

an isolator intervening between the mount plate and the support frame to substantially prevent the mount plate and the support frame from coming into direct contact with each other, the isolator consisting essentially of one or more material selected from the group consisting of aluminum oxide, aluminum nitride, silicon nitride, silicon oxide, and zirconia;

a supply section configured to supply a process gas into the process chamber;

an exhaust section configured to vacuum-exhaust the process chamber; and a heater configured to heat the target substrate on the mount plate;

wherein the support frame comprises an inwardly extending portion, on which the mount plate is mounted via the isolator; and wherein the isolator and the support frame have an outer peripheral surface and an inner peripheral surface, respectively, which face each other, and a plurality of projections are formed at intervals on either one of the outer and inner peripheral surfaces to reduce a contacting surface area therebetween.

20. The apparatus according to claim 19, wherein the isolator and the inner extending portion are arranged in contact with each other discontinuously in an angular direction to reduce a contacting surface area therebetween.

21. The apparatus according to claim 19, wherein the isolator comprises a lower member mounted on the inwardly extending portion, and an upper member formed independently of the lower member and mounted on the lower member.

22. The apparatus according to claim 21, wherein the upper member comprises an outer cover portion covering an inner edge of the support frame to prevent the process gas from entering downward.

23. A single-substrate-heat-processing apparatus for performing a semiconductor process, comprising:

an airtight process chamber;

a mount plate configured to support a target substrate within the process chamber, the mount plate consisting essentially of one or more material selected from the group consisting of silicon carbide, aluminum nitride, black aluminum nitride, and carbon coated with CVD-SiC;

a metal support frame configured to support the mount plate;

an isolator intervening between the mount plate and the support frame to substantially prevent the mount plate and the support frame from coming into direct contact with each other, the isolator consisting essentially of one or more material selected from the group consisting of aluminum oxide, aluminum nitride, silicon nitride, silicon oxide, and zirconia;

a supply section configured to supply a process gas into the process chamber;

an exhaust section configured to vacuum-exhaust the process chamber;

a heater configured to heat the target substrate on the mount plate; and a plurality of temperature-detecting members disposed at intervals in an angular direction on the mount plate, such that the temperature-detecting members extend from the support frame, penetrate the isolator, and stick into the mount plate.

24. The apparatus according to claim 23, herein the mount plate is provided with a bank formed to surround the target substrate.

25. The apparatus according to claim 23, wherein the heater comprises a heating lamp disposed below the mount plate to radiate light onto the mount plate.

* * * * *